(12) United States Patent
Dasgupta et al.

(10) Patent No.: US 9,922,826 B2
(45) Date of Patent: Mar. 20, 2018

(54) INTEGRATED CIRCUIT DIE HAVING REDUCED DEFECT GROUP III-NITRIDE LAYER AND METHODS ASSOCIATED THEREWITH

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Beaverton, OH (US); Robert S. Chau, Beaverton, OR (US); Sanaz K. Gardner, Hillsboro, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/527,287

(22) PCT Filed: Dec. 17, 2014

(86) PCT No.: PCT/US2014/070968
§ 371 (c)(1),
(2) Date: May 16, 2017

(87) PCT Pub. No.: WO2016/099494
PCT Pub. Date: Jun. 23, 2016

(65) Prior Publication Data
US 2017/0352532 A1    Dec. 7, 2017

(51) Int. Cl.
*H01L 21/02* (2006.01)
*H01L 29/20* (2006.01)
(Continued)

(52) U.S. Cl.
CPC ...... *H01L 21/0265* (2013.01); *H01L 21/0254* (2013.01); *H01L 21/0274* (2013.01);
(Continued)

(58) Field of Classification Search
CPC ............. H01L 21/0265; H01L 29/7786; H01L 29/225; H01L 29/2003; H01L 29/32;
(Continued)

(56) References Cited

U.S. PATENT DOCUMENTS

2001/0042503 A1    11/2001  Lo et al.
2008/0121903 A1*    5/2008  Hiramatsu .......... H01L 21/0237
                                                         257/89
(Continued)

FOREIGN PATENT DOCUMENTS

CN          103137434 A       6/2013

OTHER PUBLICATIONS

International Search Report and Written Opinion dated Aug. 31, 2015, issued in corresponding International Application No. PCT/US2014/070968, 11 pages.

*Primary Examiner* — Selim Ahmed

(57) ABSTRACT

Embodiments of the present disclosure are directed towards an integrated circuit (IC) die. In embodiments, an IC die may include a semiconductor substrate, a group III-Nitride or II-VI wurtzite layer disposed over the semiconductor substrate, and a plurality of buffer structures at least partially embedded in the group III-Nitride or II-VI wurtzite layer. In some embodiments, each of the plurality of buffer structures may include a central member disposed over the semiconductor substrate, a lower lateral member disposed over the semiconductor substrate and extending laterally away from the central member, and an upper lateral member disposed over the central member and extending laterally from the central member in an opposite direction from the lower (Continued)

lateral member. The plurality of buffer structures may be positioned in a staggered arrangement to terminate defects of the group III-Nitride or II-VI wurtzite layer. Other embodiments may be described and/or claimed.

25 Claims, 10 Drawing Sheets

(51) Int. Cl.
*H01L 29/225* (2006.01)
*H01L 29/205* (2006.01)
*H01L 29/32* (2006.01)
*H01L 29/08* (2006.01)
*H01L 29/06* (2006.01)
*H01L 21/027* (2006.01)
*H01L 29/66* (2006.01)
*H01L 21/8258* (2006.01)
*H01L 27/06* (2006.01)
*H01L 29/778* (2006.01)
*H01L 29/22* (2006.01)
*H01L 23/00* (2006.01)
*H01L 27/092* (2006.01)

(52) U.S. Cl.
CPC .. *H01L 21/02381* (2013.01); *H01L 21/02458* (2013.01); *H01L 21/02551* (2013.01); *H01L 21/8258* (2013.01); *H01L 27/0605* (2013.01); *H01L 29/0657* (2013.01); *H01L 29/0688* (2013.01); *H01L 29/0847* (2013.01); *H01L 29/2003* (2013.01); *H01L 29/205* (2013.01); *H01L 29/225* (2013.01); *H01L 29/32* (2013.01); *H01L 29/66462* (2013.01); *H01L 29/66969* (2013.01); *H01L 29/7786* (2013.01); *H01L 21/0256* (2013.01); *H01L 21/02554* (2013.01); *H01L 21/02557* (2013.01); *H01L 21/02562* (2013.01); *H01L 24/16* (2013.01); *H01L 27/092* (2013.01); *H01L 29/2203* (2013.01); *H01L 2224/16227* (2013.01)

(58) Field of Classification Search
CPC .......... H01L 29/0688; H01L 21/02458; H01L 21/02551; H01L 21/0274; H01L 21/02381; H01L 29/66462; H01L 29/66969; H01L 21/0254; H01L 29/0847; H01L 25/065; H01L 23/48; H01L 33/26; H01L 21/84; H01L 21/306; H01L 29/36; H01L 21/02; H01L 29/15; H01L 27/0605; H01L 29/0657; H01L 21/8258; H01L 29/205; H01L 29/2203; H01L 21/02554; H01L 21/02557; H01L 21/0256; H01L 21/02562; H01L 24/16; H01L 2224/16227; H01L 27/092; C30B 1/00
USPC ......................................................... 257/76
See application file for complete search history.

(56) References Cited

U.S. PATENT DOCUMENTS

| | | |
|---|---|---|
| 2011/0101307 A1 | 5/2011 | Lee |
| 2012/0217537 A1 | 8/2012 | Jin et al. |
| 2014/0246679 A1 | 9/2014 | Arkun et al. |
| 2015/0187924 A1* | 7/2015 | Dasgupta .......... H01L 21/30617 257/76 |
| 2017/0236704 A1* | 8/2017 | Dasgupta ............ H01L 21/0265 257/76 |
| 2017/0236936 A1* | 8/2017 | Then ................... H01L 29/7848 257/76 |

* cited by examiner

INTEGRATED CIRCUIT DIE HAVING REDUCED DEFECT GROUP III-NITRIDE LAYER AND METHODS ASSOCIATED THEREWITH

CROSS REFERENCE TO RELATED APPLICATIONS

The present application is a national phase entry under 35 U.S.C. § 371 of International Application No. PCT/US2014/070968, filed Dec. 17, 2014, entitled "INTEGRATED CIRCUIT DIE HAVING REDUCED DEFECT GROUP III-NITRIDE LAYER AND METHODS ASSOCIATED THEREWITH," which designates the United States of America, the entire disclosure of which is hereby incorporated by reference in its entirety and for all purposes.

FIELD

Embodiments of the present disclosure generally relate to the field of integrated circuits, and more particularly, to apparatuses and methods associated with an integrated circuit die having a reduced defect group III-Nitride layer.

BACKGROUND

Transistors including group III-Nitride material may be useful for high voltage or high frequency applications, and, as a result, may be promising candidates for system-on-chip (SoC) applications like power management integrated circuits (ICs) or radio frequency (RF) power amplifiers, for example. However, co-integration of group III-Nitride materials with certain types of semiconductor substrate materials (e.g., silicon (Si)) may be challenging. This is due to potentially large lattice mismatch, between the crystalline structure of the group III-Nitride materials and the certain types of semiconductor substrate materials, which may result in high defect density. In addition, mismatch in thermal expansion coefficients between the certain types of substrate material and Group III-Nitride material may result in surface cracks on the Group III-Nitride material.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale.

DETAILED DESCRIPTION

Figure 1:
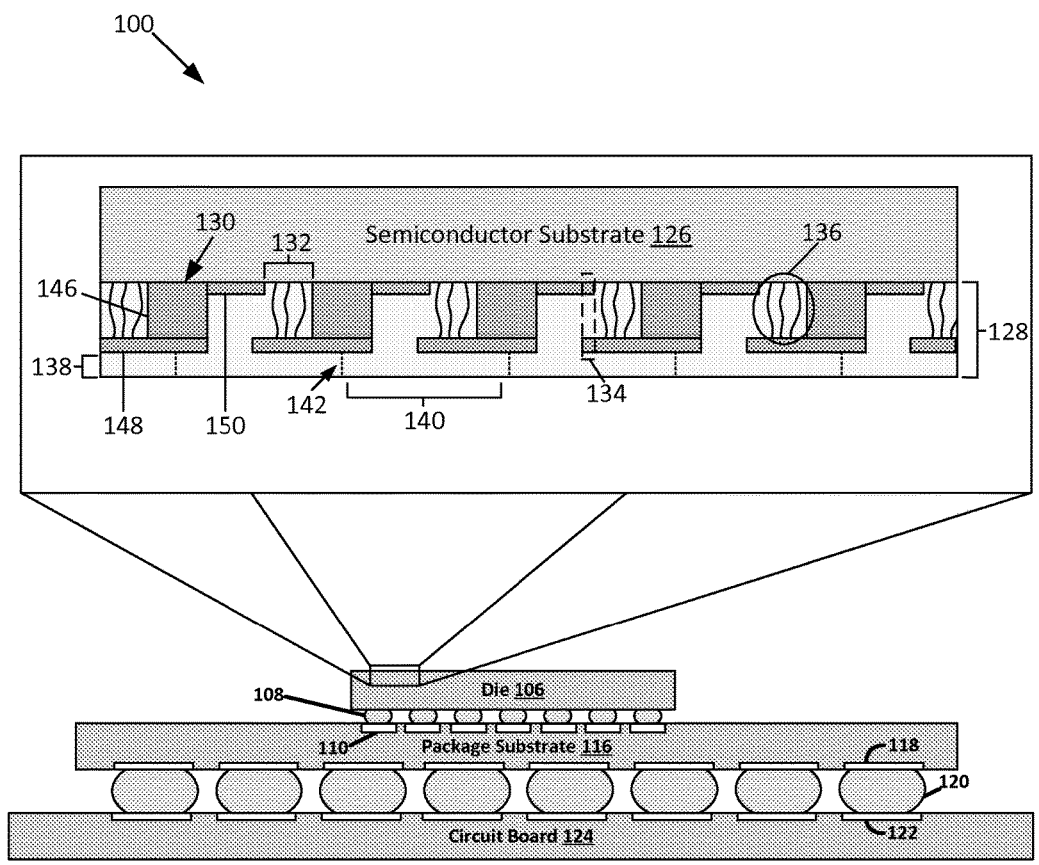
FIG. 1 schematically illustrates a cross-section side view of an example integrated circuit (IC) assembly including an IC die having reduced defect density group III-Nitride formed thereon, in accordance with various embodiments of the present disclosure.

Embodiments of the present disclosure describe integrated circuit (IC) die configurations having reduced defect group III-Nitride disposed thereon. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100. In embodiments, the IC assembly 100 may include one or more dies (e.g., die 106) electrically and/or physically coupled with a package substrate 116, as can be seen. The package substrate 116 may further be electrically coupled with a circuit board 124, as can also be seen.

In embodiments, die 106 may include a semiconductor substrate 126. Semiconductor substrate 126 may comprise any suitable material (e.g., silicon). Die 106 may also include a group III-Nitride material or II-VI wurtzite material layer 128, hereinafter referred to merely as group III-Nitride layer 128 for simplicity, disposed over the semiconductor substrate, and a plurality of buffer structures (e.g., buffer structure 130) at least partially embedded in the group III-Nitride layer 128. As used herein, group III may refer to elements in group IIIA of the chemical abstract services (CAS) grouping which include boron (B), aluminum (Al), gallium (Ga), indium (In), and titanium (Ti). Group III-Nitride materials may include, for example, gallium nitride (GaN), indium gallium nitride (InGaN), aluminum gallium nitride (AlGaN), or aluminum indium nitride (AlInN). II-VI wurtzite material on the other hand may, for example, include cadmium selenide (CdSe), cadmium sulfide (CdS), zadmium telluride (CdTe), zinc oxide (ZnO), zinc selenide (ZnSe), zinc sulfide (ZnS), zinc telluride (ZnTe).

In embodiments, each of the plurality of buffer structures may include a central member (e.g., central member 146) disposed over the semiconductor substrate. Each buffer structure may also include a lower lateral member (e.g., lower lateral member 150) disposed over the semiconductor substrate, adjacent to the central member, and extending in a lateral direction away from the central member. In addition, each buffer structure may include an upper lateral member (e.g., upper lateral member 148) disposed over the central member and extending laterally from the central member in an opposite direction from the central member than the lower lateral member. Such an buffer structure may be formed through the process described in reference to FIGS. 3 and 4, below.

As depicted, the plurality of buffer structures may be positioned in a staggered arrangement. Such a staggered arrangement is depicted by overlapping region 134, in which an upper lateral member of one of the buffer structures and a lower lateral member of an adjacent buffer structure overlap one another in a same plane extending perpendicular from the surface of the semiconductor substrate. Also as depicted, a central member of one buffer structure and a lower lateral member of an adjacent buffer structure may form a trench (e.g., trench 132). In some embodiments, the group III-Nitride layer may be grown, via, for example, lateral epitaxial overgrowth (LEO), from each of these trenches created by adjacent buffer structures. Such growth may result in defects (e.g., defects 136) originating from the trenches. Such defects may include threading dislocations of the group III-Nitride layer that may be caused by a lattice mismatch between the crystalline structure of the semiconductor material of semiconductor substrate 126 and that of the group III-Nitride material of group III-Nitride layer 128. In addition, by reducing the amount of group III-Nitride material interfacing with the semiconductor substrate down to the group III-Nitride material disposed in the trenches, surface defects, which may result from the differences in thermal expansion coefficients between the group III-Nitride material and the semiconductor substrate material, may be reduced or eliminated.

In embodiments, the above discussed buffer structures may be utilized to terminate the above discussed defects. By utilizing the buffer structures to terminate the defects, a sub-layer 138 of the group III-Nitride layer disposed over the plurality of buffer structures may include portions (e.g., portion 140) of group III-Nitride material that may have substantially fewer defects than that of the group III-Nitride layer disposed between adjacent buffer structures of the plurality of buffer structures. In some embodiments, such portions of sub-layer 138 may be substantially defect free. While these portions of sub-layer 138 may be substantially defect free, sub-layer 138 may also include junctions, e.g., junction 142, depicted by the dotted lines extending vertically from the plurality of buffer structures. These junctions may be caused by an interface between group III-Nitride material originating from one of the trenches discussed above and group III-Nitride material originating from an adjacent trench. Such a junction may be indicated by a line of defects and may be detected through any conventional mechanism, such as, for example, transmission electron microscopy (TEM). As discussed in reference to FIG. 8, these junctions may, in some embodiments, be used in the formation of transistors on the group III-Nitride layer.

Die 106 may be attached to package substrate 116 according to a variety of suitable configurations, including a flip-chip configuration, as depicted, or other configurations such as, for example, being embedded in the package substrate 116 or being configured in a wirebonding arrangement. In the flip-chip configuration, the die 106 may be attached to a surface of the package substrate 116 via die interconnect structures 108 such as bumps, pillars, or other suitable structures that may also electrically couple die 106 with the package substrate 116.

Die 106 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of die 106 and/or interconnect structures 108. Die interconnect structures 108 may be configured to route the electrical signals between die 106 and package substrate 116.

Package substrate 116 may include electrical routing features configured to route electrical signals to or from die 106. The electrical routing features may include, for example, traces disposed on one or more surfaces of package substrate 116 and/or internal routing features such as, for example, trenches, vias, or other interconnect structures to route electrical signals through package substrate 116. For example, in some embodiments, package substrate 116 may include electrical routing features (such as die bond pads 110) configured to receive the die interconnect structures 108 and route electrical signals between die 106 and package substrate 116. In some embodiments, the package substrate 116 is an epoxy-based laminate substrate having a core and/or build-up layers such as, for example, an Ajinomoto Build-up Film (ABF) substrate.

The circuit board 124 may be a printed circuit board (PCB) composed of an electrically insulative material such as an epoxy laminate. For example, the circuit board 124 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias, may be formed through the electrically insulating layers to route the electrical signals of the die 106 through the circuit board 124. The circuit board 124 may be composed of other suitable materials in other embodiments. In some embodiments, the circuit board 124 is a motherboard (e.g., motherboard 1002 of FIG. 10).

Package-level interconnects such as, for example, solder balls 120 or land-grid array (LGA) structures may be coupled to one or more lands (hereinafter "lands 118") on package substrate 116 and one or more pads 122 on the circuit board 124 to form corresponding solder joints that are configured to further route the electrical signals between the package substrate 116 and the circuit board 124. Other suitable techniques to physically and/or electrically couple the package substrate 116 with the circuit board 124 may be used in other embodiments.

Figure 2:
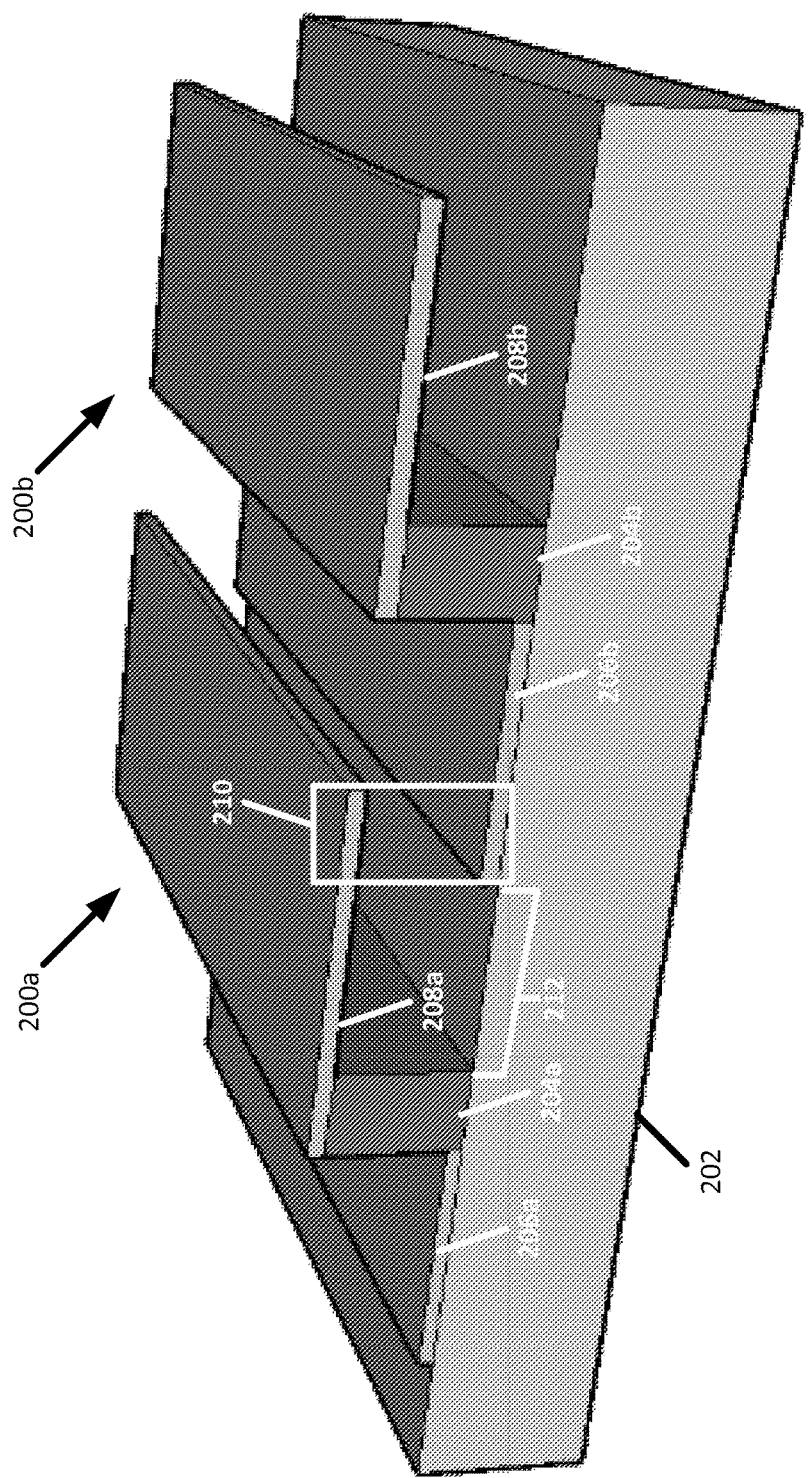
FIG. 2 is a perspective view of a semiconductor substrate having two buffer structures disposed thereon, in accordance with various embodiments of the present disclosure.

FIG. 2 is a perspective view of a semiconductor substrate 202 having two buffer structures 200a and 200b disposed thereon, in accordance with various embodiments of the present disclosure. In embodiments, each buffer structure may include a central member 204a and 204b disposed over the semiconductor substrate. Each buffer structure may also include a lower lateral member 206a and 206b disposed over the semiconductor substrate, adjacent to the central member, and extending in a lateral direction away from the central member. In addition, each buffer structure may include an upper lateral member 208a and 208b disposed over the central member and extending laterally from the central member in an opposite direction from the central member than the lower lateral member. Such an buffer structure may be formed through the process described in reference to FIGS. 3 and 4, below.

As depicted, buffer structures 200a and 200b may be positioned in a staggered arrangement. Such a staggered arrangement is depicted by overlapping region 210, in which upper lateral member 208a of buffer structure 200a and lower lateral member 206b of buffer structure 200b overlap one another in a same plane extending perpendicular from the surface of semiconductor substrate 202. Also as depicted, central member 204a of buffer structure 200a and lower lateral member 206b of buffer structure 200b may form trench 212 from which a group III-Nitride material, or II-VI wurtzite material as discussed above in reference to FIG. 1, may be grown to form a group III-Nitride layer, such as group III-Nitride layer 128 of FIG. 1.

Figure 3:
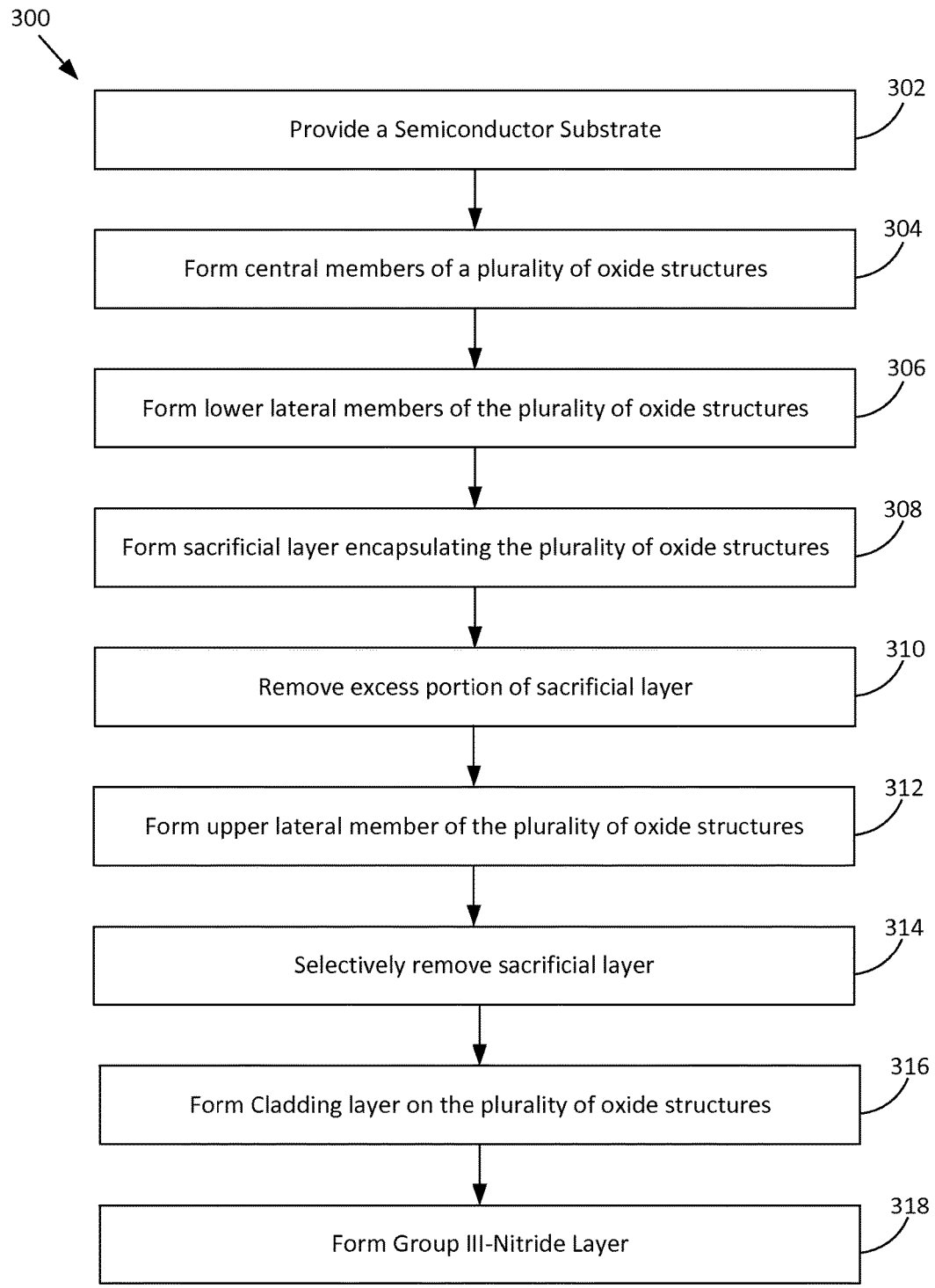
FIG. 3 is an illustrative flow diagram of an integrated circuit (IC) die fabrication process in accordance with various embodiments of the present disclosure.
Figure 4:
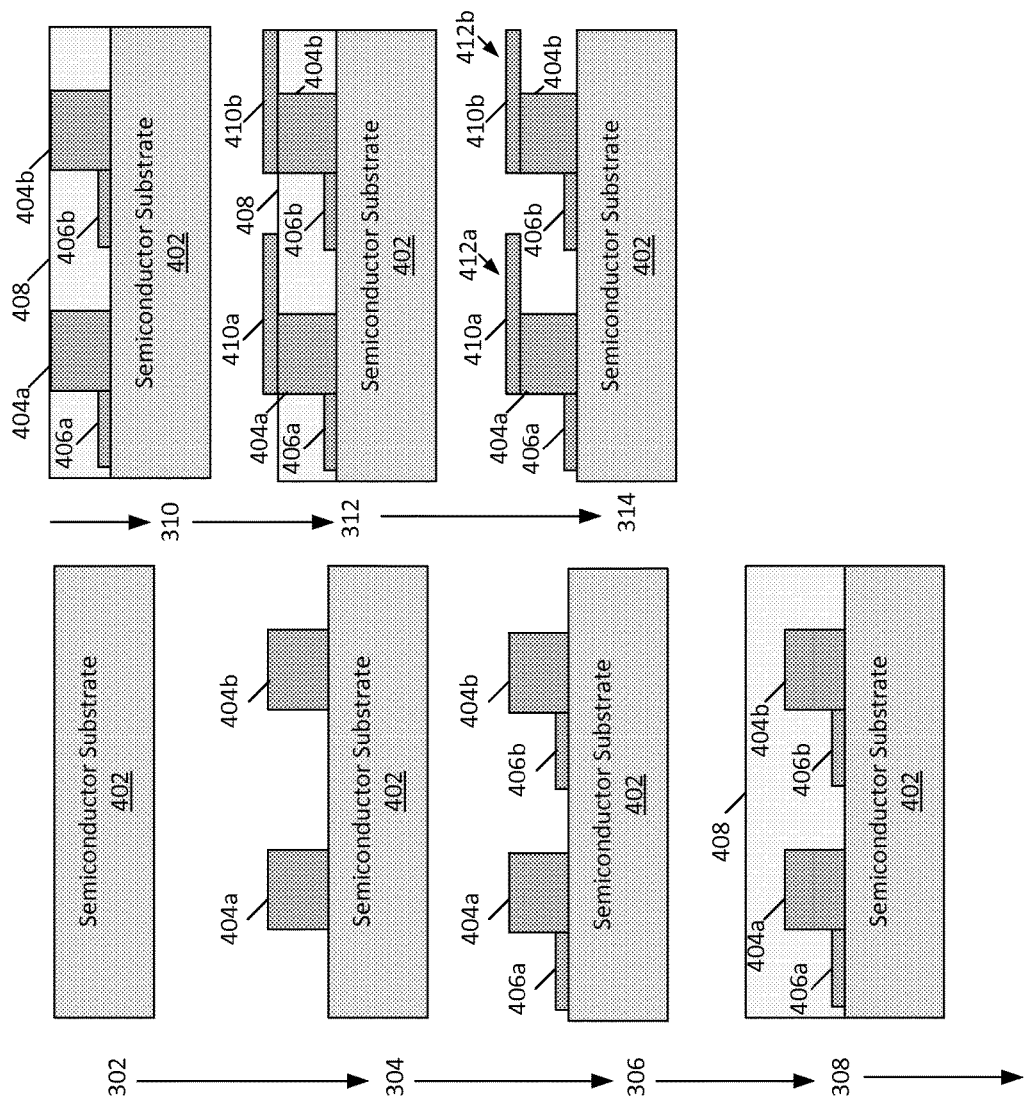
FIG. 4 depicts illustrative cross-section views of selected operations in the IC die fabrication process of FIG. 3, in accordance with various embodiments of the present disclosure.

FIG. 3 is an illustrative flow diagram of an integrated circuit (IC) die fabrication process 300 in accordance with various embodiments of the present disclosure. FIG. 4 provides cross-section views of selected operations illustrating stages in the IC die fabrication process 300, in accordance with various embodiments. As a result, FIGS. 3 and 4 will be described in conjunction with one another. To aid in this description, the operations performed in FIG. 3 are referenced on the arrows moving from operation to operation in FIG. 4. Process 300 may begin at block 302 where a semiconductor substrate 402 may be provided. Such a semiconductor substrate may comprise any suitable material including silicon, such as a silicon wafer cut along the 100 plane, the 111 plane, or the 110 plane without miscut, or with miscut ranging from 0.5 degrees to 8 degrees. At block 304 central members 404a and 404b may be formed. Central members 404a and 404b may comprise any suitable oxide, such as aluminum oxide ($Al_2O_3$) or silicon dioxide ($SiO_2$), hafnium oxide ($HfO_2$), tantalum silicon oxide (TaSiOx), aluminum silicon oxide ($AlSiO_x$), SiON, silicon carbonitride (SiCN), titanium dioxide ($TiO_2$), etc. Central members 404a and 404b may be formed through any conventional process, including, but not limited to, a photolithography process. At block 306, lower lateral members 406a and 406b may be formed on semiconductor substrate 402. Lower lateral members 406a and 406b may comprise any suitable oxide, such as those examples mentioned above. In embodiments, lower lateral members 406a and 406b may be the same material as that utilized in forming central members 404a and 404b or may be a different material. For example, central members 404a and 404b may comprise $Al_2O_3$ while lower lateral members 406a and 406b may comprise $SiO_2$. As with central members 404a and 404b, lower lateral members 406a and 406b may also be formed through any conventional process, including, but not limited to, a photolithography process.

At block 308 a sacrificial layer 408 may be formed to encapsulate the partially formed buffer structures comprising central members 404a and 404b and lower lateral members 406a and 406b. Such a sacrificial layer may include any material that may be selectively removed through, for example, a wet-etch process. Such material may include, but is not limited to, silicon nitride (SiN), bisbenzocyclobutane (BOB), hydrogen silsesquioxane (HSQ), ruthenium (Ru), titanium nitride (TiN), etc. At block 310 a portion of sacrificial layer 408 extending above central members 404a and 404b may be removed (e.g., in a polishing process) to expose top surfaces of central members 404a and 404b.

At block 312 upper lateral members 410a and 410b may be formed on a surface of sacrificial layer 408 and the exposed top surfaces of central members 404a and 404b. Upper lateral members 410a and 410b may comprise any suitable oxide, such as aluminum oxide ($Al_2O_3$) or silicon dioxide ($SiO_2$) and may be the same material as that utilized in forming central members 404a and 404b or may be different material. As with central members 404a and 404b and lower lateral members 406a and 406b, upper lateral members may be formed through any conventional process, including, but not limited to, a photolithography process.

At block 314, sacrificial layer 408 may be selectively removed. Such selective removal may be accomplished, for example, via a wet etch process designed to remove the sacrificial layer without disturbing the buffer structures formed through the above described process. Such a wet-etch process may include, for example, utilizing a hot phosphoric acid bath. Once sacrificial layer 408 is removed, at block 316, a cladding layer, such as cladding layer 702 of FIG. 7, may optionally be deposited across surfaces of buffer structures 412a and 412b and any exposed surfaces of semiconductor substrate. Such a cladding layer may comprise aluminum nitride (AlN), boron nitride (BN), or titanium nitride (TiN) and may be deposited by way of chemical vapor deposition, atomic layer deposition, molecular beam epitaxy, or a sputtering process. At block 318, a layer of group III-Nitride or II-VI wurtzite layer may be formed, such as that depicted in FIGS. 1 and 5-8. Such a layer may comprise, for example, gallium nitride (GaN), or any other group III-Nitride materials, or any II-VI wurtzite materials, and may be formed through any conventional process, such as, for example, a LEO process.

Figure 5:
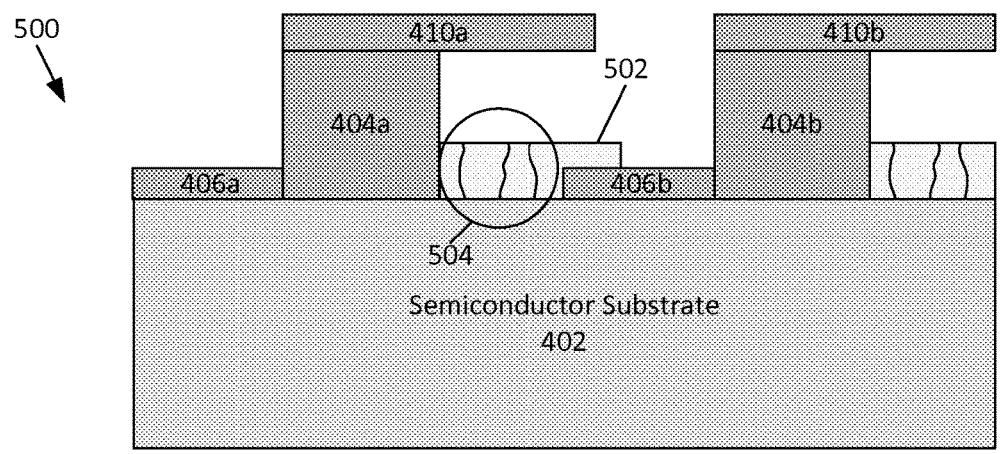
FIGS. 5-6 depict various embodiments of additional operations of the IC die fabrication process of FIG. 3, in accordance with various embodiments of the present disclosure.
Figure 5:
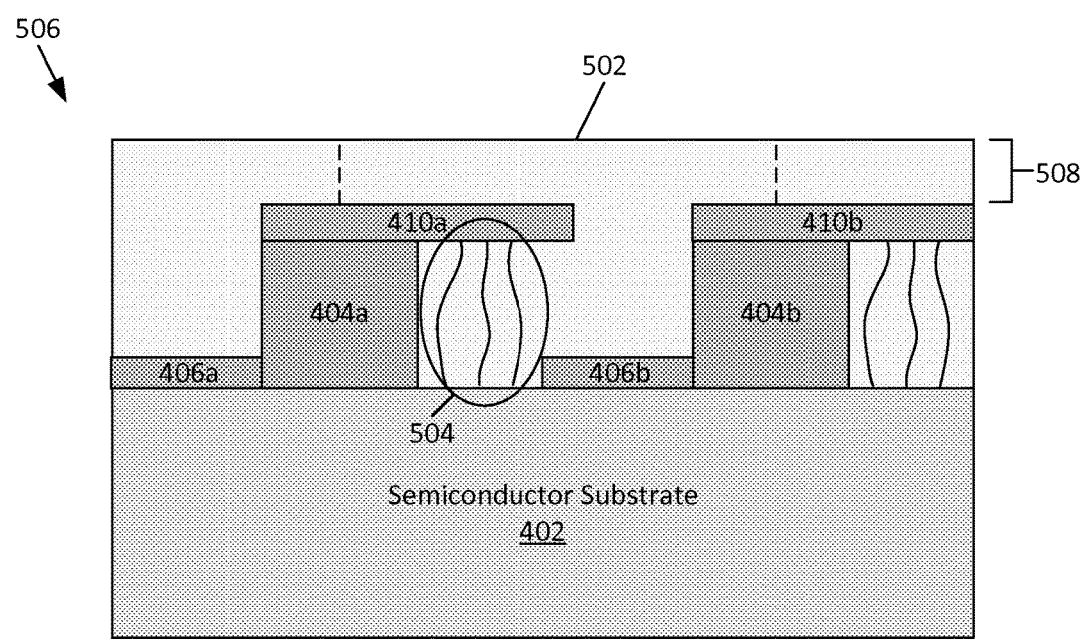
Figure 6:
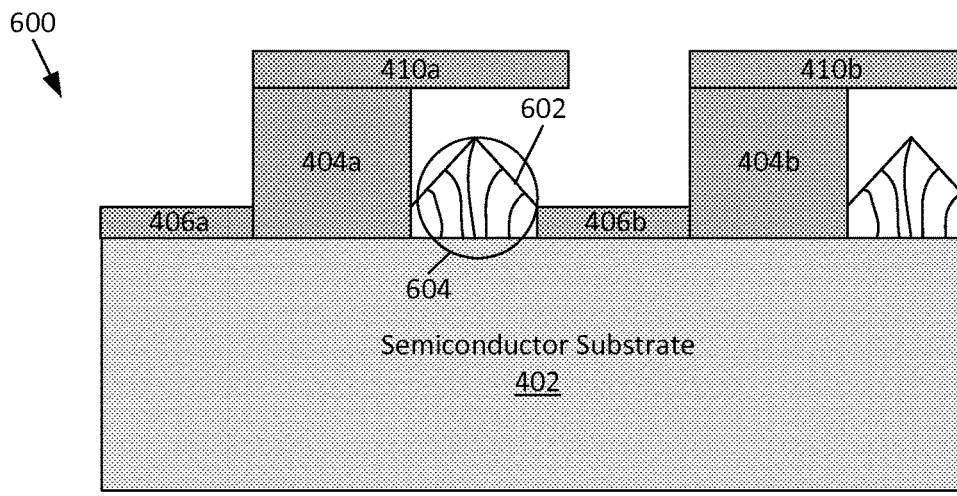
Figure 6:
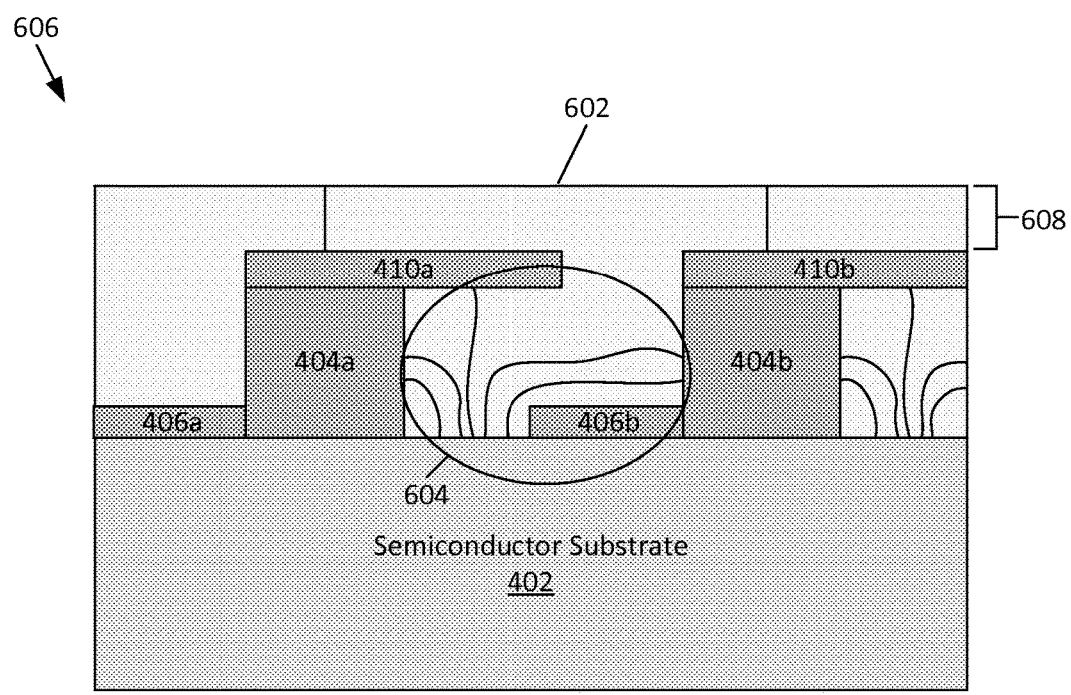

FIGS. 5 and 6 depict operation 318 of IC die fabrication process 300 of FIG. 3, in accordance with various embodiments of the present disclosure. FIG. 5 depicts an embodiment where defects (e.g., defects 504) are allowed to propagate vertically until being terminated by upper lateral members 410a and 410b. As discussed above, such defects may result from a lattice mismatch between the group III-Nitride material 502 and semiconductor substrate 402. In other embodiments, II-VI wurtzite material may be utilized in place of group III-Nitride material 502; however, for the sake of simplicity, this discussion will merely refer to group III-Nitride material. As depicted, such embodiments may result from adjusting the conditions of, for example, an epitaxial growth process, to result in vertical sidewall planes. These conditions are discussed in greater detail below. Illustration 500 depicts a snapshot of the growth of the group III-Nitride material, having vertical sidewalls. Illustration 506 depicts a result of additional growth and demonstrates how upper lateral members 410a and 410b terminate the resulting defects resulting in sub-layer 508 having portions of group III-Nitride material that are substantially defect free. In some embodiments, an etch stop/polish stop process may be utilized to peel off sub-layer 508, which may provide a group III-Nitride layer with portions of reduced defect group III-Nitride for layer transfer applications. Such an embodiment may be detected via the junctions discussed elsewhere herein. As mentioned above, such junctions may be detected by TEM, for example.

FIG. 6, on the other hand, depicts an embodiment where some defects (e.g., defects 604) are bent to allow some of the defects to propagate horizontally until being terminated by central members 404a and 404b. As discussed above, such defects may result from a lattice mismatch between the group III-Nitride material 602 and semiconductor substrate 402. As depicted, such embodiments may result from adjusting the conditions of, for example, an epitaxial growth process, to result in inclined sidewall facets. These conditions are discussed in greater detail below. Illustration 600 depicts a snapshot of the growth of the group III-Nitride material, having inclined sidewall facets. Illustration 606 depicts a result of additional growth and demonstrates how upper lateral members 410a and 410b terminate any defects that remain in the vertical plain, while central members 404a and 404b terminate the defects that were bent and propagated horizontally, resulting in sub-layer 608 having portions of group III-Nitride material that are substantially defect free. In some embodiments, an etch stop/polish stop process may be utilized to peel off sub-layer 608, which may provide a group III-Nitride layer with portions of reduced defect group III-Nitride for layer transfer applications. Such an embodiment may be detected via the junctions discussed elsewhere herein. As mentioned above, such junctions may be detected by TEM, for example.

Pressure, temperature, and V/III gas mixture ratio are all conditions of the growth process that may contribute to the shape of the growth (e.g., whether the sidewalls are vertical or inclined). Lower growth pressure may favor growth of vertical sidewall planes, while higher growth pressure may favor the inclined sidewall planes. For example, pressure conditions in growing GaN may range from 30 to 350 Torr. Temperature may also be controlled to favor the inclined sidewall facets described above. A higher growth temperature may favor the growth of vertical sidewall planes whereas a lower growth temperature may favor the inclined sidewall facets. For example, temperature conditions in growing GaN may range from 900 to 1150° C. In addition, group V/group III precursor gas mixture ratio may also be controlled to favor the inclined sidewall facets described above. A lower V/III ratio may favor vertical sidewall planes whereas a higher V/III ratio may favor the formation of inclined sidewall facets. For example, for GaN embodiments where the group V precursor is $NH_3$ and the group III precursor is tri-methyl-gallium (TMG), the V/III ratio may be in the range of 100-5000. Following this guidance, one of ordinary skill may determine a suitable LEO process space that may be further utilized in any of the methods described herein to fabricate the various structures and devices.

Figure 7:
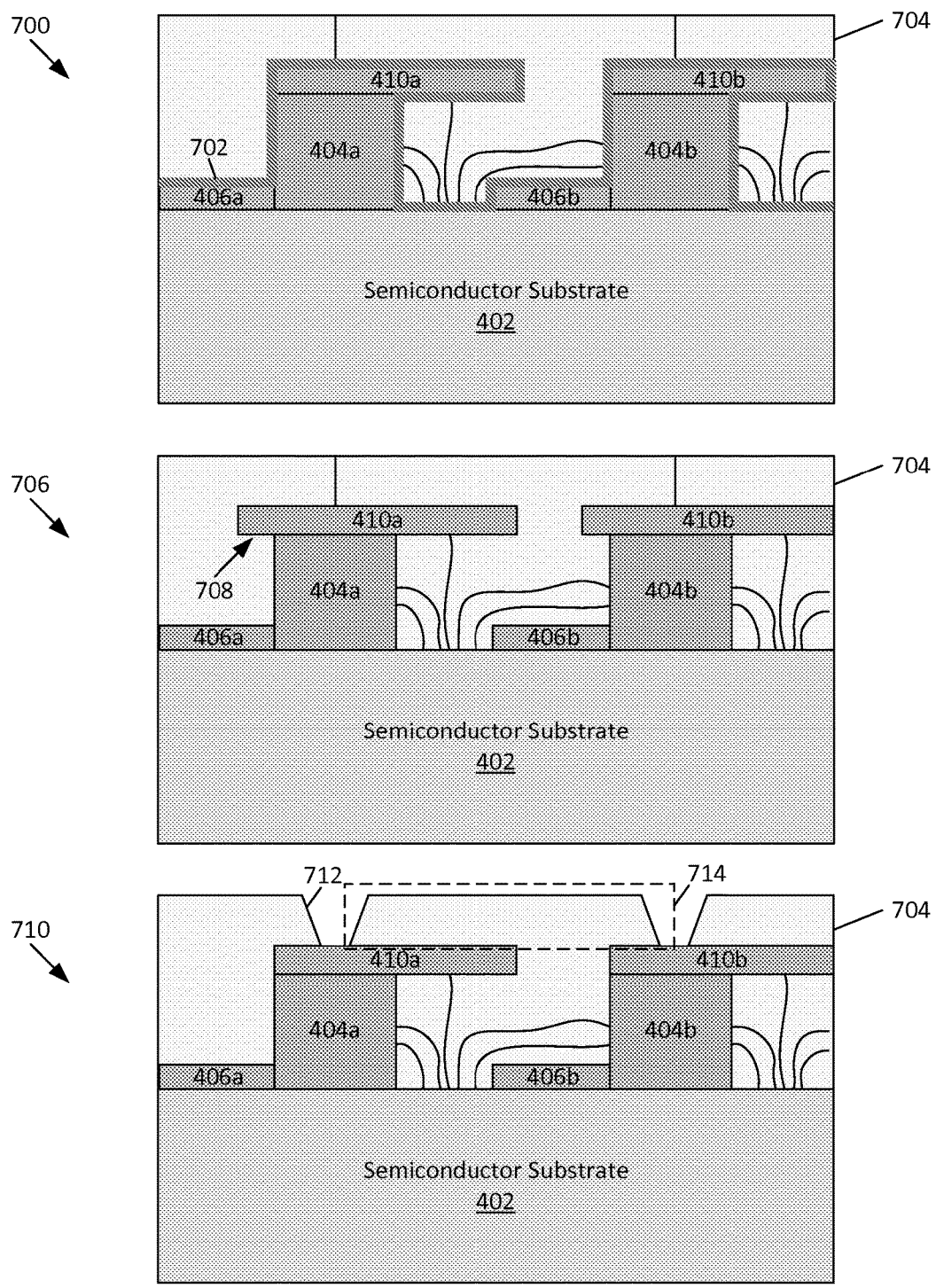
FIG. 7 depicts various embodiments of an IC die assembly, in accordance with the present disclosure.

FIG. 7 depicts various embodiments, 700, 706, and 710, of an IC die assembly, in accordance with the present disclosure. Embodiment 700 depicts an illustrative embodiment where a cladding layer 702, such as that discussed above in reference to block 316 of FIG. 3, may be disposed between the plurality of buffer structures and group III-Nitride layer 704 as well as between the semiconductor substrate and the group III-Nitride layer 704. As mentioned above, a layer of II-VI wurtzite material may, in some embodiments, be utilized in place of group III-Nitride layer 704; however, for the sake of simplicity, this discussion will merely refer to group III-Nitride. Cladding layer 702 may, in some embodiments, comprise AlN, BN, or TiN and may be deposited by way of chemical vapor deposition, atomic layer deposition, molecular beam epitaxy, or a sputtering process. In some embodiments, the thickness of cladding layer 702 may range from 3 nanometers (nm) to 100 nm, although other thicknesses may be utilized depending on an anticipated application. Cladding layer 702 may permit nucleation of foreign material on the semiconductor substrate 402. For example, an AlN cladding layer may prevent the mixing of group III-Nitride atoms with semiconductor substrate 402. For example, at high temperature, Ga atoms and Si atoms may react with one another, which may prevent epitaxial growth of GaN.

Embodiment 706 depicts an alternative buffer structure that may be utilized in various embodiments. As depicted by overhang 708, in such an buffer structure, upper lateral members 410a and 410b may extend laterally away from central members 404a and 404b in the same direction as lower lateral members 406a and 406b. Such an upper lateral member may be formed as described above in reference to FIG. 3.

Embodiment 710 depicts an embodiment where the formation of group III-Nitride layer 704 was stopped prior to the formation of the junctions discussed elsewhere herein. In such an embodiment, the horizontal plane, also known as the c-plane, of the top surface of the group III-Nitride layer 704 may have high charge density, while the sidewalls (e.g., sidewall 712) may have a lower charge density. The substantially trapezoidal structure, highlighted by box 714, of group III-Nitride material disposed above the buffer structures may, in some embodiments, have a very low defect density or may be substantially defect free. In some embodiments, a three-dimensional device structure may be formed on such substantially trapezoidal structures. For example, in some embodiments, a transistor may be formed on such a substantially trapezoidal structure. In such an embodiment, a two-dimensional electron gas (2DEG) inducing layer, such as 2DEG layer 814 of FIG. 8 discussed below, may be disposed on a surface group III-Nitride layer 704. The source and drain contacts of the transistor may then be formed in the voids on opposite ends of the substantially trapezoidal structure and a gate may be formed in the center.

It will be appreciated that any of the embodiments discussed herein may be formed in various combinations. For example, the buffer structure depicted in embodiment 700 may be utilized in place of any other buffer structure discussed herein. Cladding layer 702, discussed above, may also be utilized in any of the embodiments discussed herein, including embodiment 710 discussed above.

Figure 8:
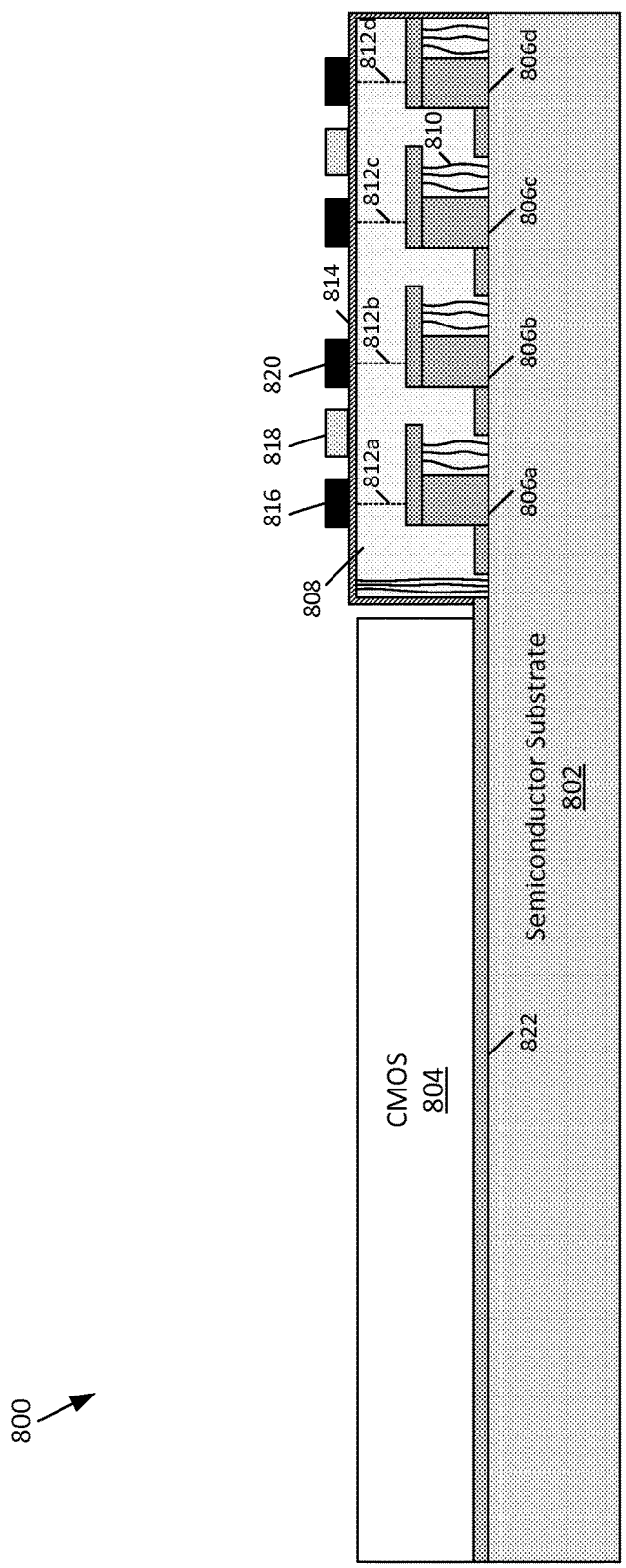
FIG. 8 schematically illustrates a cross-section side view of an example integrated circuit (IC) die having reduced defect density group III-Nitride formed thereon, in accordance with various embodiments of the present disclosure.

FIG. 8 schematically illustrates a cross-section side view of an example integrated circuit (IC) die 800 including a reduced defect density group III-Nitride layer 808 formed thereon, in accordance with various embodiments of the present disclosure. In embodiments, die 800 may include a semiconductor substrate 802. Semiconductor substrate 802 may comprise any suitable material (e.g., silicon). Die 800 may also include a group III-Nitride (e.g., gallium nitride (GaN)) layer 808, or II-VI wurtzite material layer, disposed over the semiconductor substrate, and a plurality of buffer structures 806a-806d at least partially embedded in group III-Nitride layer 808. In embodiments, each of the plurality of buffer structures may include a central member, a lower lateral member, and an upper lateral member as discussed elsewhere herein.

As depicted, and discussed elsewhere herein, the plurality of buffer structures 806a-806d may be positioned in a staggered arrangement. In some embodiments, the group III-Nitride layer 808 may be grown, via, for example, lateral epitaxial overgrowth (LEO) from trenches created by adjacent buffer structures. Such growth may result in defects (e.g., defects 810) originating from the trenches. Such defects may include, for example, threading dislocations of the group III-Nitride layer 808 that may be caused by a lattice mismatch between the crystalline structure of the semiconductor material of semiconductor substrate 802 and that of the group III-nitride material of group III-nitride layer 808.

In embodiments, buffer structures 806a-806d may be utilized to terminate the above discussed defects. By utilizing the buffer structures to terminate the defects, a sub-layer of the group III-Nitride layer disposed over the plurality of buffer structures 806a-806d may include portions of group III-Nitride material that may have substantially fewer defects than that of the group III-Nitride layer 808 disposed between adjacent buffer structures of the plurality of buffer structures 806a-806d. In some embodiments, such portions of the sub-layer may be substantially defect free. While these portions of the sub-layer may be substantially defect free, the sub-layer may also include junctions 812a-812d depicted by the dotted lines extending vertically from the plurality of buffer structures. These junctions may be caused by an interface between group III-Nitride material originating from one of the trenches and group III-Nitride material originating from an adjacent trench. Such a junction may be indicated by a line of defects and may be detected through any conventional mechanism, such as, for example, transmission electron microscopy (TEM). As depicted, these junctions may, in some embodiments, be used in the formation of transistors on group III-Nitride layer 808. For example, as depicted, source 816 of a transistor may be disposed on junction 812a while a drain 820 of the transistor may be disposed on junction 812b. In such embodiments, a gate 818 of the transistor may be disposed on a portion of the sub-layer between the source and the drain of the transistor that may also coincide with a portion of the sub-layer that may be substantially defect free. In some embodiments, a two-dimensional electron gas (2DEG) inducing layer 814 may be disposed on a surface group III-Nitride layer 808. Such a 2DEG inducing layer may comprise aluminum gallium nitride (AlGaN), aluminum indium nitride (AlInN), aluminum nitride (AlN), or any other suitable material. Die 800 may also include a complementary metal-oxide-semiconductor (CMOS) device 804. CMOS device 804 may include any embodiments and may be formed on an oxide layer 822. In embodiments, die 800 may be a system-on-chip (SoC) and the transistor discussed above may be a part of a power management IC for the system-on-chip, or may be part of a radio frequency (RF) power amplifier of the SoC, such as that utilized in a mobile phone.

Figure 9:
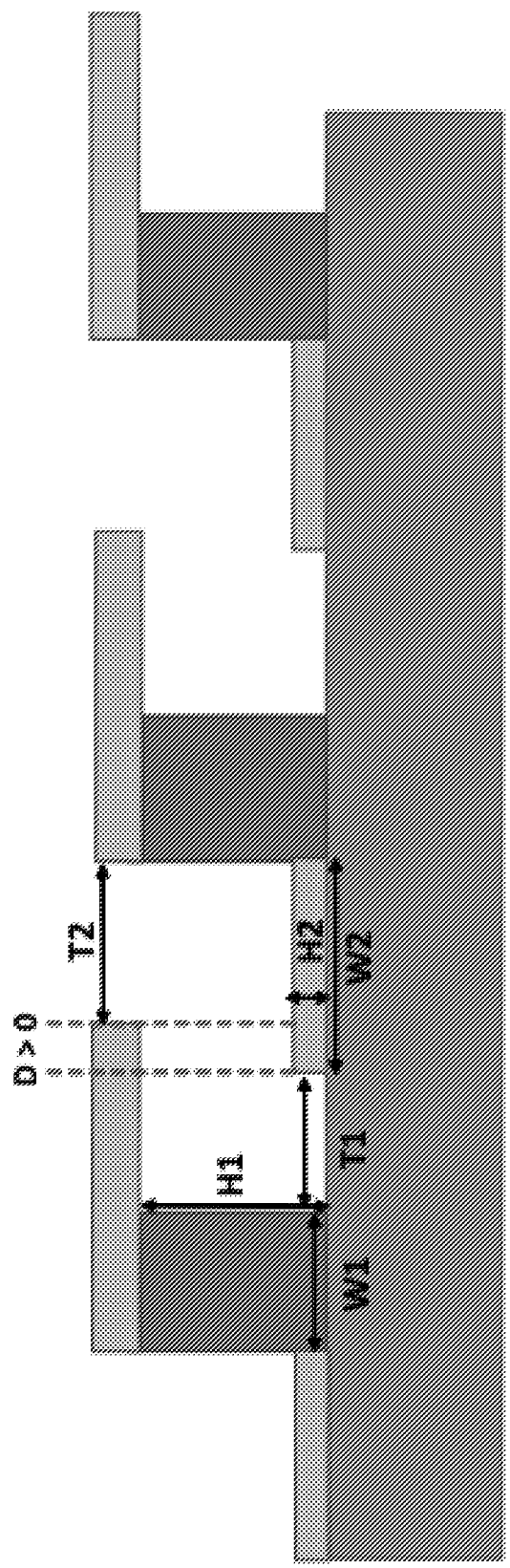
FIG. 9 depicts illustrative dimensions of various embodiments.

FIG. 9 depicts illustrative dimensions of various embodiments. As depicted, in embodiments, the thickness of a lower lateral member, H2, may range from 20 nm to 100 nm, and the width, W2, may range from 100 nm to 1 micrometer (um). The width of the trench T1 may range from 20 nm to 1 um. The width of a central member, W1, may range from 100 nm to 5 um. The height of a central member, H1, may depend on whether the group III-Nitride is grown to have inclined sidewall facets or vertical sidewall planes. In embodiments, utilizing the vertical sidewall planes, H1 may be a represented by the equation H1>H2+50 nm, or may range from 70 nm to 150 nm based upon the illustrative range for H2 given above. In embodiments utilizing inclined sidewall facets to bend defects into the horizontal plane, H1 may be determined by the equation $$H1 > \sqrt{3} * \frac{T1}{2} + H2.$$

Finally, the width between the upper lateral members, T2, may be defined by the equation T2<W2−D, where D is the overlap between the upper lateral member of one buffer structure and the lower lateral member of an adjacent buffer structure. The described features may have other suitable dimensions in other embodiments.

As mentioned throughout this description, in some embodiments, group III-Nitride material may be replaced with II-VI wurtzite material. As a result, any instances of the use of group III-Nitride material, or layer, mentioned herein may also include embodiments where the group III-Nitride material, or layer, is replaced with a II-VI wurtzite material, or layer.

Figure 10:
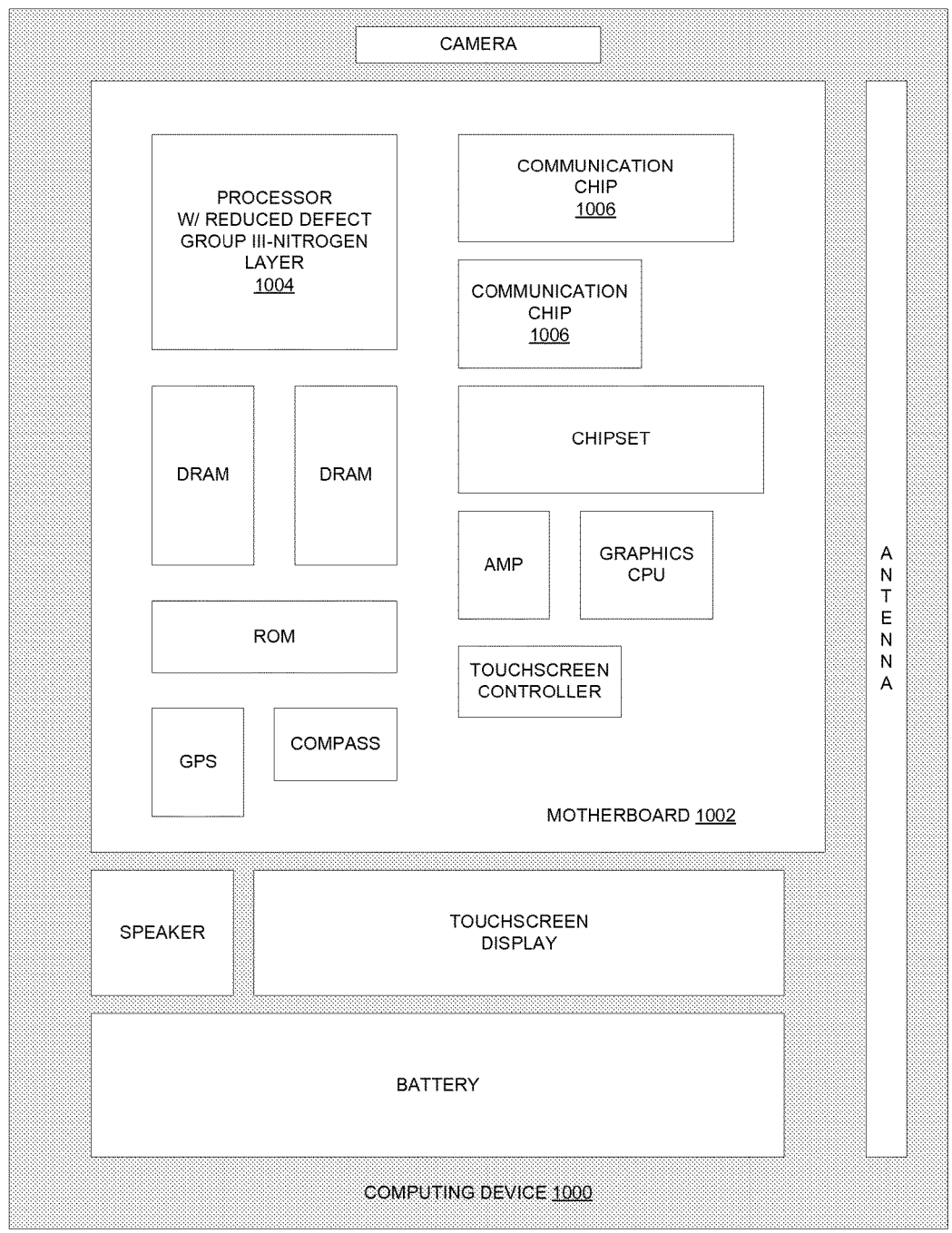
FIG. 10 schematically illustrates a computing device that includes an integrated circuit die, in accordance with various embodiments of the present disclosure.

Embodiments of the present disclosure may be implemented into a system using any suitable hardware and/or software to configure as desired. FIG. 10 schematically illustrates a computing device that includes an IC die as described herein, such as that depicted by FIGS. 1-8. The computing device 1000 may house a board such as motherboard 1002. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., dynamic random access memory (DRAM)), non-volatile memory (e.g., read-only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, EV-DO, and others.

The processor 1004 of the computing device 1000 may be an IC die (e.g., IC die 106 of FIG. 1) incorporated into an IC assembly that may include a package substrate (e.g., package substrate 116 of FIG. 1). For example, the circuit board 124 of FIG. 1 may be a motherboard 1002 and the processor 1004 may be IC die 106. The processor 1004 and the motherboard 1002 may be coupled together using package-level interconnects as described herein. The term "processor" may refer to any device or portion of a device that processes electronic data from registers and/or memory to transform that electronic data into other electronic data that may be stored in registers and/or memory.

The communication chip 1006 may be an IC die (e.g., IC die 106) incorporated into an IC assembly that may include a package substrate (e.g., package substrate 116 of FIG. 1). In further implementations, another component (e.g., memory device or other integrated circuit device) housed within the computing device 1000 may be an IC die (e.g., IC die 106) incorporated into an IC assembly.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Examples

According to various embodiments, the present disclosure describes a number of examples. Example 1 may include an integrated circuit (IC) die comprising: a semiconductor substrate; a group III-Nitride or II-VI wurtzite layer disposed over the semiconductor substrate; and a plurality of buffer structures at least partially embedded in the group III-Nitride or II-VI wurtzite layer, wherein each buffer structure of the plurality of buffer structures includes: a central member disposed over the semiconductor substrate; a lower lateral member disposed over the semiconductor substrate adjacent to the central member and extending in a first direction away from the central member; and an upper lateral member disposed over the central member and extending laterally in at least a second direction, opposite the first direction, from the central member.

Example 2 may include the subject matter of Example 1, wherein the plurality of buffer structures are positioned in a staggered arrangement to terminate defects of the group III-Nitride or II-VI wurtzite layer.

Example 3 may include the subject matter of either of Examples 1 or 2, wherein the plurality of buffer structures include a first buffer structure disposed adjacent to a second buffer structure, wherein an upper lateral member of the first buffer structure and a lower lateral member of the second buffer structure overlap one another in a same plane extending perpendicular from the surface of the semiconductor substrate, and wherein a central member of the first buffer structure and the lower lateral member of the second buffer structure form a trench in which group III-Nitride or II-VI wurtzite material of the group III-Nitride or II-VI wurtzite layer is disposed.

Example 4 may include the subject matter of any one of Examples 1-3, wherein a sub-layer of the group III-Nitride or II-VI wurtzite layer disposed over the plurality of buffer structures includes portions of group III-Nitride or II-VI wurtzite material having substantially fewer defects than that of the group III-Nitride or II-VI wurtzite layer disposed between adjacent buffer structures of the plurality of buffer structures.

Example 5 may include the subject matter of Example 4, wherein the portions of group III-Nitride or II-VI wurtzite material are substantially defect free.

Example 6 may include the subject matter of Example 4, wherein the sub-layer includes a junction where first group III-Nitride or II-VI wurtzite material of the group III-Nitride or II-VI wurtzite layer originates from between a first buffer structure and a second buffer structure and second group III-Nitride or II-VI wurtzite material originates from between the second buffer structure and a third buffer structure interface.

Example 7 may include the subject matter of Example 6, wherein the junction is indicated by a line of defects disposed over the second buffer structure.

Example 8 may include the subject matter of either of Examples 6 or 7, wherein the junction is a first junction, the sub-layer further comprising a second junction disposed over the third buffer structure, wherein a source of a transistor is disposed at the first junction and a drain of a transistor is disposed at the second junction and a gate of the transistor is disposed between the first and second junction on one of the portions of group III-Nitride or II-VI wurtzite material having substantially fewer defects.

Example 9 may include the subject matter of any one of Examples 1-8, further comprising a semiconductor complementary metal-oxide-semiconductor (CMOS) device disposed on a surface of the semiconductor substrate.

Example 10 may include the subject matter of any one of Examples 1-9, wherein the central member of each of the plurality of buffer structures is composed of a different oxide material than the upper or lower lateral members of the respective buffer structure.

Example 11 may include the subject matter of any one of Examples 1-10, further comprising a cladding layer disposed between the group III-Nitride or II-VI wurtzite layer and the plurality of buffer structures.

Example 12 may include the subject matter of Example 11, wherein the cladding layer comprises aluminum nitride (AlN), aluminum gallium nitride (AlGaN), boron nitride (BN), or titanium nitride (TiN).

Example 13 may include the subject matter of any one of Examples 1-12, wherein: the group III-Nitride or II-VI wurtzite layer comprises gallium nitride (GaN), indium gallium nitride (InGaN), aluminum gallium nitride (AlGaN), aluminum indium nitride (AlInN), cadmium selenide (CdSe), cadmium sulfide (CdS), zadmium telluride (CdTe), zinc oxide (ZnO), zinc selenide (ZnSe), zinc sulfide (ZnS), or zinc telluride (ZnTe); and the semiconductor substrate comprises silicon (Si).

Example 14 may include the subject matter of any one of Examples 1-13, wherein the defects include threading dislocations of the group III-Nitride or II-VI wurtzite layer.

Example 15 may include a method of forming an integrated circuit (IC) die assembly comprising: providing a semiconductor substrate; forming a plurality of buffer structures in a staggered arrangement, wherein forming each buffer structure of the plurality of buffer structures includes: forming a central member over the semiconductor substrate; forming a lower lateral member over the semiconductor substrate adjacent to the central member and extending in a first direction away from the central member; and forming an upper lateral member over the central member that extends laterally in at least a second direction, opposite the first direction, from the central member; and forming a group III-Nitride or II-VI wurtzite layer at least partially encapsulating the plurality of buffer structures, Example 16 may include the subject matter of Example 15 wherein the plurality of buffer structures terminate defects in the group III-Nitride or II-VI wurtzite layer.

Example 17 may include the subject matter of either of Examples 15 or 16, wherein forming an upper lateral member further comprises encapsulating the central member and the lower lateral member in a sacrificial layer, forming the upper lateral member on a surface of the sacrificial layer, and selectively removing the sacrificial layer.

Example 18 may include the subject matter of any one of Examples 15-17, wherein forming the central member, the lower lateral member, and the upper lateral member include performing a photolithography process for each of the central member, the lower lateral member, and the upper lateral member.

Example 19 may include the subject matter of any one of Examples 15-18, wherein forming the plurality of buffer structures in the staggered arrangement comprises forming a first buffer structure and a second buffer structure adjacent to one another, wherein an upper lateral member of the first buffer structure and a lower lateral member of the second buffer structure overlap one another in a same plane extending perpendicular from a surface of the semiconductor substrate, and wherein a central member of the first buffer structure and the lower lateral member of the second buffer structure form a trench.

Example 20 may include the subject matter of Example 19, wherein forming the group III-Nitride or II-VI wurtzite layer is accomplished at least in part via a lateral epitaxial overgrowth (LEO) process originating from the trench.

Example 21 may include the subject matter of any one of Examples 15-20, wherein forming the group III-Nitride or II-VI wurtzite layer includes forming a sub-layer of the group III-Nitride or II-VI wurtzite layer over the plurality of buffer structures that includes portions of group III-Nitride or II-VI wurtzite material having substantially fewer defects than that of the group III-Nitride or II-VI wurtzite layer formed between adjacent buffer structures of the plurality of buffer structures.

Example 22 may include the subject matter of Example 21, wherein the portions of group III-Nitride or II-VI wurtzite material are substantially defect free.

Example 23 may include the subject matter of either of Examples 21 or 22, wherein the sub-layer includes a junction where first group III-Nitride or II-VI wurtzite material of the group III-Nitride or II-VI wurtzite layer originates from between a first buffer structure and a second buffer structure and second group III-Nitride or II-VI wurtzite material originates from between the second buffer structure and a third buffer structure interface, and wherein the junction is indicated by a line of defects disposed over the second buffer structure.

Example 24 may include the subject matter of Example 23, wherein the junction is a first junction, the sub-layer further comprising a second junction formed over the third buffer structure, the method further comprising: forming a source of a transistor at the first junction; forming a drain of the transistor at the second junction; and forming a gate of the transistor between the first junction and the second junction on one of the portions of group III-Nitride or II-VI wurtzite material having substantially fewer defects.

Example 25 may include the subject matter of any one of Examples 15-24, further comprising forming a semiconductor complementary metal-oxide-semiconductor (CMOS) device on a surface of the semiconductor substrate.

Example 26 may include the subject matter of any one of Examples 15-225, further comprising forming a cladding layer over the plurality of buffer structures prior to the forming of the group III-Nitride or II-VI wurtzite layer, wherein the cladding layer comprises aluminum nitride (AlN), aluminum gallium nitride (AlGaN), boron nitride (BN), or titanium nitride (TiN).

Example 27 may include the subject matter of any one of Examples 15-226, wherein: the group III-Nitride or II-VI wurtzite layer comprises gallium nitride (GaN), indium gallium nitride (InGaN), aluminum gallium nitride (AlGaN), aluminum indium nitride (AlInN), cadmium selenide (CdSe), cadmium sulfide (CdS), zadmium telluride (CdTe), zinc oxide (ZnO), zinc selenide (ZnSe), zinc sulfide (ZnS), or zinc telluride (ZnTe); and the semiconductor substrate comprises silicon (Si).

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) die comprising:
   a semiconductor substrate;
   a group III-Nitride or II-VI wurtzite layer disposed over the semiconductor substrate; and
   a plurality of buffer structures at least partially embedded in the group III-Nitride or II-VI wurtzite layer, wherein each buffer structure of the plurality of buffer structures includes:
   a central member disposed over the semiconductor substrate;
   a lower lateral member disposed over the semiconductor substrate adjacent to the central member and extending in a first direction away from the central member; and
   an upper lateral member disposed over the central member and extending laterally in at least a second direction, opposite the first direction, from the central member.

2. The IC die of claim 1, wherein the plurality of buffer structures are positioned in a staggered arrangement to terminate defects of the group III-Nitride or II-VI wurtzite layer.

3. The IC die of claim 1, wherein the plurality of buffer structures include a first buffer structure disposed adjacent to a second buffer structure, wherein an upper lateral member of the first buffer structure and a lower lateral member of the second buffer structure overlap one another in a same plane extending perpendicular from the surface of the semiconductor substrate, and wherein a central member of the first buffer structure and the lower lateral member of the second buffer structure form a trench in which group III-Nitride or II-VI wurtzite material of the group III-Nitride or II-VI wurtzite layer is disposed.

4. The IC die of claim 1, wherein a sub-layer of the group III-Nitride or II-VI wurtzite layer disposed over the plurality of buffer structures includes portions of group III-Nitride or II-VI wurtzite material having substantially fewer defects than that of the group III-Nitride or II-VI wurtzite layer disposed between adjacent buffer structures of the plurality of buffer structures.

5. The IC die of claim 4, wherein the portions of group III-Nitride or II-VI wurtzite material are substantially defect free.

6. The IC die of claim 4, wherein the sub-layer includes a junction where first group III-Nitride or II-VI wurtzite material of the group III-Nitride or II-VI wurtzite layer originates from between a first buffer structure and a second buffer structure and second group III-Nitride or II-VI wurtzite material originates from between the second buffer structure and a third buffer structure interface.

7. The IC die of claim 6, wherein the junction is indicated by a line of defects disposed over the second buffer structure.

8. The IC die of claim 6, wherein the junction is a first junction, the sub-layer further comprising a second junction disposed over the third buffer structure, wherein a source of a transistor is disposed at the first junction and a drain of a transistor is disposed at the second junction and a gate of the transistor is disposed between the first and second junction on one of the portions of group III-Nitride or II-VI wurtzite material having substantially fewer defects.

9. The IC die of claim 1, further comprising a semiconductor complementary metal-oxide-semiconductor (CMOS) device disposed on a surface of the semiconductor substrate.

10. The IC die of claim 1, wherein the central member of each of the plurality of buffer structures is composed of a different oxide material than the upper or lower lateral members of the respective buffer structure.

11. The IC die of claim 1, further comprising a cladding layer disposed between the group III-Nitride or II-VI wurtzite layer and the plurality of buffer structures.

12. The IC die of claim 11, wherein the cladding layer comprises aluminum nitride (AlN), aluminum gallium nitride (AlGaN), boron nitride (BN), or titanium nitride (TiN).

13. The IC die of claim 1, wherein:
the group III-Nitride or II-VI wurtzite layer comprises gallium nitride (GaN), indium gallium nitride (InGaN), aluminum gallium nitride (AlGaN), aluminum indium nitride (AlInN), cadmium selenide (CdSe), cadmium sulfide (CdS), zadmium telluride (CdTe), zinc oxide (ZnO), zinc selenide (ZnSe), zinc sulfide (ZnS), or zinc telluride (ZnTe); and
the semiconductor substrate comprises silicon (Si).

14. The IC die of claim 2, wherein the defects include threading dislocations of the group III-Nitride or II-VI wurtzite layer.

15. A method of forming an integrated circuit (IC) die assembly comprising:
providing a semiconductor substrate;
forming a plurality of buffer structures in a staggered arrangement, wherein forming each buffer structure of the plurality of buffer structures includes:
forming a central member over the semiconductor substrate;
forming a lower lateral member over the semiconductor substrate adjacent to the central member and extending in a first direction away from the central member; and
forming an upper lateral member over the central member that extends laterally in at least a second direction, opposite the first direction, from the central member; and
forming a group III-Nitride or II-VI wurtzite layer at least partially encapsulating the plurality of buffer structures, wherein the plurality of buffer structures terminate defects in the group III-Nitride or II-VI wurtzite layer.

16. The method of claim 15, wherein forming an upper lateral member further comprises encapsulating the central member and the lower lateral member in a sacrificial layer, forming the upper lateral member on a surface of the sacrificial layer, and selectively removing the sacrificial layer.

17. The method of claim 15, wherein forming the central member, the lower lateral member, and the upper lateral member include performing a photolithography process for each of the central member, the lower lateral member, and the upper lateral member.

18. The method of claim 15, wherein forming the plurality of buffer structures in the staggered arrangement comprises forming a first buffer structure and a second buffer structure adjacent to one another, wherein an upper lateral member of the first buffer structure and a lower lateral member of the second buffer structure overlap one another in a same plane extending perpendicular from a surface of the semiconductor substrate, and wherein a central member of the first buffer structure and the lower lateral member of the second buffer structure form a trench.

19. The method of claim 18, wherein forming the group III-Nitride or II-VI wurtzite layer is accomplished at least in part via a lateral epitaxial overgrowth (LEO) process originating from the trench.

20. The method of claim 15, wherein forming the group III-Nitride or II-VI wurtzite layer includes forming a sub-layer of the group III-Nitride or II-VI wurtzite layer over the plurality of buffer structures that includes portions of group III-Nitride or II-VI wurtzite material having substantially fewer defects than that of the group III-Nitride or II-VI wurtzite layer formed between adjacent buffer structures of the plurality of buffer structures and, wherein the portions of group III-Nitride or II-VI wurtzite material are substantially defect free.

21. The method of claim 20, wherein the sub-layer includes a junction where first group III-Nitride or II-VI wurtzite material of the group III-Nitride or II-VI wurtzite layer originates from between a first buffer structure and a second buffer structure and second group III-Nitride or II-VI wurtzite material originates from between the second buffer structure and a third buffer structure interface, and wherein the junction is indicated by a line of defects disposed over the second buffer structure.

22. The method of claim 21, wherein the junction is a first junction, the sub-layer further comprising a second junction formed over the third buffer structure, the method further comprising:
forming a source of a transistor at the first junction;
forming a drain of the transistor at the second junction; and
forming a gate of the transistor between the first junction and the second junction on one of the portions of group III-Nitride or II-VI wurtzite material having substantially fewer defects.

23. The method of claim 15, further comprising forming a semiconductor complementary metal-oxide-semiconductor (CMOS) device on a surface of the semiconductor substrate.

24. The method of claim 15, further comprising forming a cladding layer over the plurality of buffer structures prior to the forming of the group III-Nitride or II-VI wurtzite layer, wherein the cladding layer comprises aluminum nitride (AlN), aluminum gallium nitride (AlGaN), boron nitride (BN), or titanium nitride (TiN).

25. The method of claim 15, wherein:
the group III-Nitride or II-VI wurtzite layer comprises gallium nitride (GaN), indium gallium nitride (InGaN), aluminum gallium nitride (AlGaN), aluminum indium nitride (AlInN), cadmium selenide (CdSe), cadmium sulfide (CdS), zadmium telluride (CdTe), zinc oxide (ZnO), zinc selenide (ZnSe), zinc sulfide (ZnS), or zinc telluride (ZnTe); and
the semiconductor substrate comprises silicon (Si).

* * * * *